US011107665B2

(12) United States Patent
Deng et al.

(10) Patent No.: US 11,107,665 B2
(45) Date of Patent: Aug. 31, 2021

(54) FEEDING STRUCTURE, UPPER ELECTRODE ASSEMBLY, AND PHYSICAL VAPOR DEPOSITION CHAMBER AND DEVICE

(71) Applicant: BEIJING NAURA MICROELECTRONICS EQUIPMENT CO., LTD., Beijing (CN)

(72) Inventors: Yuchun Deng, Beijing (CN); Chao Zhang, Beijing (CN); Peng Chen, Beijing (CN); Guoqing Qiu, Beijing (CN); Mengxin Zhao, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 16/726,023

(22) Filed: Dec. 23, 2019

(65) Prior Publication Data
US 2020/0135438 A1  Apr. 30, 2020

Related U.S. Application Data

(63) Continuation of application No. PCT/CN2018/091642, filed on Jun. 15, 2018.

(30) Foreign Application Priority Data

Jun. 29, 2017  (CN) .......................... 201710518535.1

(51) Int. Cl.
*H01J 37/34*  (2006.01)
*C23C 14/34*  (2006.01)
*C23C 14/35*  (2006.01)

(52) U.S. Cl.
CPC ...... *H01J 37/3405* (2013.01); *C23C 14/3407* (2013.01); *C23C 14/35* (2013.01);
(Continued)

(58) Field of Classification Search
CPC ............... H01J 37/3455; H01J 37/3411; H01J 37/3435; H01J 37/3438; H01J 37/3444;
(Continued)

(56) References Cited

U.S. PATENT DOCUMENTS

2013/0256127 A1  10/2013  Young et al.

FOREIGN PATENT DOCUMENTS

| CN | 102918175 A | 2/2013 |
|---|---|---|
| CN | 104412718 A | 3/2015 |

(Continued)

OTHER PUBLICATIONS

Machine Translation WO 2014/082554 (Year: 2014).*
(Continued)

*Primary Examiner* — Rodney G McDonald
(74) *Attorney, Agent, or Firm* — Anova Law Group PLLC

(57) ABSTRACT

The present disclosure provides a feeding structure, an upper electrode assembly, and a physical vapor deposition chamber and device. In the present disclosure a RF power is fed through the center of a first introduction member of the feeding structure and is evenly distributed onto a target by a plurality of distribution members.

20 Claims, 5 Drawing Sheets

(52) U.S. Cl.
CPC ..... *H01J 37/3435* (2013.01); *H01J 2237/026* (2013.01); *H01J 2237/20214* (2013.01); *H01J 2237/332* (2013.01)

(58) Field of Classification Search
CPC ............ H01J 37/3405; H01J 2237/026; H01J 2237/20214; H01J 2237/332; C23C 14/3407; C23C 14/35
USPC .............. 204/298.08, 298.2, 298.09, 298.19; 118/723 E, 723 ER
See application file for complete search history.

(56) References Cited

FOREIGN PATENT DOCUMENTS

| | | | |
|---|---|---|---|
| CN | 105074873 A | | 11/2015 |
| CN | 107090574 A | | 8/2017 |
| JP | 2003-147522 | * | 5/2003 |
| TW | 201439358 A | | 10/2014 |
| TW | 201612345 A | | 4/2016 |
| TW | 201716614 A | | 5/2017 |
| WO | WO 2014082554 | * | 6/2014 |

OTHER PUBLICATIONS

Machine Translation JP 2003-147522 (Year: 2003).*
The World Intellectual Property Organization (WIPO) International Search Report for PCT/CN2018/091642 dated Aug. 16, 2018 6 Pages.

* cited by examiner

FEEDING STRUCTURE, UPPER ELECTRODE ASSEMBLY, AND PHYSICAL VAPOR DEPOSITION CHAMBER AND DEVICE

CROSS-REFERENCE TO RELATED APPLICATION

This application is a continuation application of International Application No. PCT/CN2018/091642, filed on Jun. 15, 2018, which in turn claims priority to Chinese Patent Application No. 201710518535.1 filed on Jun. 29, 2017. The entire content of which is incorporated herein by reference.

TECHNICAL FIELD

The present disclosure relates to the field of semiconductor manufacturing technology, and more specifically, to a feeding structure, an upper electrode assembly, and a physical vapor deposition chamber and device.

BACKGROUND

With the continued development of the 14/16 nanometer process of semiconductors, the development of TiN high density film of has become the key technology for the development of hard mask TiN physical vapor deposition (PVD) device. In order to obtain a high quality TiN film, it is necessary to simultaneously load direct current (DC) power and very high frequency (VHF) radio frequency (RF) power on a target. VHF may refer to the frequency band of 30 MHz to 300 MHz. With the assist of a magnetic field, the DC negative pressure on the target may ionize the gas to generate a plasma, and attract positive ions to blast the target for a sputter deposition. Further, the VHF RF power may promote the gas ionization rate and facilitate the formation of a denser film.

SUMMARY

An aspect of the present disclosure provides a feeding structure for a physical vapor deposition device. The feeding structure includes: a first introduction member configured to receive power; a second introduction member coupled to the first introduction member; and a plurality of distribution members evenly distributed around an axis of the first introduction member. In particular, one end of each distribution member is coupled to the second introduction member and the other end of each distribution member is used to provide power to a target.

In some embodiments, the first introduction member and the second introduction member are disposed coaxially with the target.

In some embodiments, the second introduction member includes a plurality of holes disposed symmetrically about a center of the second introduction member.

In some embodiments, the plurality of holes are arranged in a multi-ring structure on the second introduction member, each ring structure includes the same number of holes, and a radius of the holes increases in a direction from the center of the second introduction member to an edge of the second introduction member.

In some embodiments, the distribution members include a circular cross-section, and a diameter of the distribution members is 10 mm or more.

Another aspect of the present disclosure provides an upper electrode assembly including a first introduction member configured to receive power; a second introduction member coupled to the first introduction member; a plurality of distribution members evenly distributed around an axis of the first introduction member; and a radio frequency (RF) power supply or a direct current (DC) power supply coupled to the first introduction member.

In some embodiments, the upper electrode assembly further includes: a support base and a magnetron bearing housing. One end of the support base is used to support the second introduction member and the other end of the support base is used to fix the target, and the plurality of distribution members are disposed in the support base and configured to couple to the target. The magnetron bearing housing mounted to the support base for converting an external drive along a first axis to an output drive along a second axis, the first axis being offset from an axis of the first introduction member.

In some embodiments, the support base further includes: a support wall and a partition layer. One end of the support wall is used to support the second introduction member and the other end of the support wall is fixed to the target. The partition layer is laterally disposed within the support wall to divide the support wall into a first chamber facing the second introduction member and a second chamber facing the target. The magnetron bearing housing is disposed in the first chamber and includes: an input shaft configured to receive the external drive along the first axis; an output shaft extending through the partition layer into the second chamber and outputting the output drive along the second axis, the second axis coincides with the axis of the first introduction member. In addition, the upper electrode assembly further includes: a magnetron assembly disposed within the second chamber and mounted on the output shaft.

In some embodiments, the upper electrode assembly further includes a motor disposed outside the first chamber. In particular, the input shaft of the magnetron bearing housing passes through the second introduction member and connects to an output shaft of the motor.

In some embodiments, the upper electrode assembly further includes a motor disposed within the first chamber and covered by a shielding structure. In particular, the input shaft of the magnetron bearing housing is connected to an output shaft of the motor.

In some embodiments, the support base includes a support wall and a support cover. One end of the support wall is connected to the support cover to form a third chamber, and the other end of the support wall is fixed to the target. The support cover is used to support the second introduction member. The magnetron bearing housing is disposed in the third chamber and covered by a waterproof structure including: an input shaft configured to receive the external drive along the first axis; and an output shaft extending through the partition layer into the third chamber and outputting the output drive along the second axis, the second axis coincides with the axis of the first introduction member. The upper electrode assembly further includes: a magnetron assembly disposed within the third chamber and mounted on the output shaft.

In some embodiments, the upper electrode assembly further includes: a motor disposed outside the third chamber. In particular, the input shaft of the magnetron bearing housing passes through the support cover and the second introduction member in sequence and connects to an output shaft of the motor.

In some embodiments, the upper electrode assembly further includes: a motor disposed in the third chamber and covered by the waterproof structure. In particular, the input shaft of the magnetron bearing housing is connected to an output shaft of the motor.

In some embodiments, the upper electrode assembly further includes: a shielding cover arranged on a periphery of the support base; and a shielding plate disposed on a top end of the shielding cover and fixed to a top surface of the second introduction member by an insulating pad, and the first introduction member passes through the shielding plate.

Another aspect of the present disclosure provides a physical vapor deposition chamber. The physical vapor deposition chamber includes: a chamber body; and an upper electrode assembly disposed on top of the chamber body. In particular, the upper electrode assembly includes a feeding structure comprising a first introduction member configured to receive power; a second introduction member coupled to the first introduction member; a plurality of distribution members evenly distributed around an axis of the first introduction member; and a radio frequency (RF) power supply or a direct current (DC) power supply coupled to the first introduction member.

Another aspect of the present disclosure provides a physical vapor deposition device including a physical vapor deposition chamber. The physical vapor deposition chamber includes a chamber body; and an upper electrode assembly disposed on top of the chamber body. In particular, the upper electrode assembly includes a feeding structure comprising a first introduction member configured to receive power; a second introduction member coupled to the first introduction member; a plurality of distribution members evenly distributed around an axis of the first introduction member; and a radio frequency (RF) power supply or a direct current (DC) power supply coupled to the first introduction member.

BRIEF DESCRIPTION OF THE DRAWINGS

In order to illustrate the technical solutions in accordance with the embodiments of the present disclosure more clearly, the accompanying drawings to be used for describing the embodiments are introduced briefly in the following. It is apparent that the accompanying drawings in the following description are only some embodiments of the present disclosure. Persons of ordinary skill in the art can obtain other accompanying drawings in accordance with the accompanying drawings without any creative efforts.

DESCRIPTION OF THE REFERENCE NUMERALS

Figure 1:
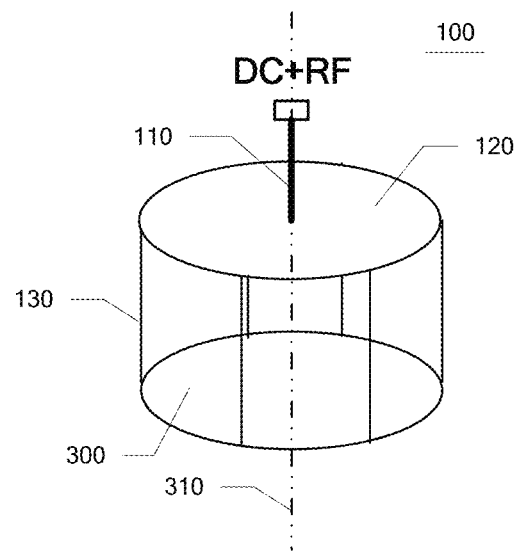
FIG. 1 is a structural view of a feeding structure according to an embodiment of the present disclosure.

100 Feeding structure
110 First introduction member
120 Second introduction member
121 Hole
130 Distribution member
140 Introduction ring
150 Export ring
200 Upper electrode assembly
210 Support base
211 Support wall
211a First chamber
211b Second chamber
211c Third chamber
212 Partition layer
213 Support cover
220 Magnetron bearing housing
230 Magnetron assembly
240 Motor
250 Shielding cover
260 Shielding plate
261 Cover opening mechanism connector
262 Insulating pad
270 Photoelectric detection assembly
271 Reflective plate
272 Photoelectric sensor
273 Quartz window
281 Shielding structure
282 Waterproof structure
290 Magnetic inductive detection assembly
291 Magnet
292 Magnetic proximity switch
300 Target
310 Axis

DETAILED DESCRIPTION OF THE EMBODIMENTS

The technical solutions provided in the embodiments of the present disclosure will be described below with reference to the drawings. However, it should be understood that the following embodiments do not limit the disclosure. It will be appreciated that the described embodiments are some rather than all of the embodiments of the present disclosure. Other embodiments conceived by those having ordinary skills in the art on the basis of the described embodiments without inventive efforts should fall within the scope of the present disclosure.

RF power and/or DC power is generally provided to the target through a feeding structure. When a 60 MHz or 40 MHz VHF RF power supply and a DC power supply are used for processing, the introduction of voltage and current of the power supply and the uniformity of its distribution on the target may directly affect the thickness uniformity of the film obtained by the sputter deposition. In conventional technology, the feeding structure of the PVD device, the position of the axis of the target is generally occupied by a magnetron bearing housing of an upper electrode assembly, such that the introduction of the power supply may need to be offset. As such, the power supply may only be input from a position that is not the axis of the target, and this configuration often affects the thickness uniformity of the film. Further, the feeding structure generally employs a thin plate-shaped part. The plate-shaped structure may have high impedance, which may easily lead to waste of power. When a RF power supply with higher frequency is used, the effect of the offset power introduction and the impedance may become more prominent.

The present disclosure is further described in detail below with reference to the specific embodiments and reference accompanying drawings.

FIG. 1 is a structural view of a feeding structure according to an embodiment of the present disclosure. As a part of the upper electrode assembly, the feeding structure may be used to provide power to the target more uniformly to achieve uniform sputtering of the target.

As shown in FIG. 1, a feeding structure 100 includes a first introduction member 110, a second introduction member 120, and a plurality of distribution members 130. In some embodiments, the first introduction member 110 may have a rod-like structure, and the second introduction member 120 may have a plate-like structure. One end of the first introduction member 110 may be connected to a power supply (not shown) to receive power output by the power supply (e.g., a DC power, a RF power, etc.), and the other end of the first introduction member 110 may be coupled to the second introduction member 120. The distribution members 130 may be metal screws made of, for example, copper, having a diameter of 10 mm or more. In particular, metal screws with large cross-section may reduce the impedance of the transmission path, reduce power consumption, and reduce power waste. The distribution members 130 may be evenly distributed around the axis of the first introduction member 110. Further, one end of each distribution member 130 may be coupled to the second introduction member, and the other end of each distribution member 130 may be coupled to a target 300 to provide power to the target 300. In some embodiments, an axis 310 of the target 300 may coincide with the axes of the first introduction member 110 and the second introduction member 120, and the three axes may be coaxially disposed.

In the present embodiment, the first introduction member 110 of the feeding structure may be coupled to the second introduction member 120 along the axis of the second introduction member 120. During processing, power may be supplied to the center of the second introduction member 120 along the first introduction member 110, and uniformly distributed from the center of the second introduction member 120 to the edge of the second introduction member 120. The distribution members 130 may be evenly distributed around the axis of the first introduction member 110, that is, evenly distributed around the axis of the second introduction member 120. Further, the power of the power supply maybe evenly distributed to the respective distribution members 130 by the edges of the second introduction member 120. In some embodiments, each distribution member 130 may also be uniformly distributed about the axis 310 of the target 300, and the distribution members 130 may uniformly feed power to the target 300.

As shown in FIG. 1, the feeding structure 100 includes six distribution members 130, however, the number of the distribution members 130 is merely illustrative. In other exemplary embodiments, the number of the distribution members 130 may be set as needed, such as, but is not limited to, 8, 12, 16, 24, etc.

As shown in FIG. 1, the axis of the second introduction member 120 coincides with the axis of the first introduction member 110 and the target 300, however, the present disclosure is not limited thereto. For example, the shape and size of the second introduction member 120 and the target 300 may not be identical, and the positions of the second introduction member 120 and the target 300 may not completely aligned. As such, the axis of the second introduction member 120 may not coincide with the axis 310 of the first introduction member 110 and the target 300, but the axis of the first introduction member 110 may still coincide with the axis of the target 300, and the plurality of distribution members 130 may be evenly distributed around the axis 310, such that power may be uniformly fed to the target 300.

In conventional technology, when the feeding structure is assembled on the upper electrode assembly, since the magnetron bearing housing of the upper electrode assembly may occupy the position of the axis of the second introduction member and the target, the position of the first introduction member may need to be offset, and the structure of the "offset feeding with the center magnetron" may affect the uniformity of the thickness of the sputtered film. In the feeding structure 100 of the present embodiment, the first introduction member 110 may be fed centrally, and the distribution members 130 may be evenly distributed around the axis of the first introduction member 110 to achieve uniform power distribution.

Figure 2:
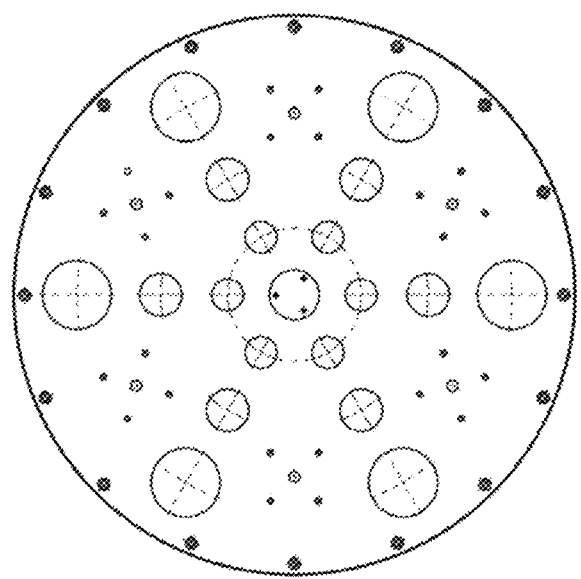
FIG. 2 is a structural view of a second introduction member of the feeding structure according to an embodiment of the present disclosure.

FIG. 2 is a structural view of a second introduction member of the feeding structure according to an embodiment of the present disclosure. As shown in FIG. 2, a plurality of holes 121 are symmetrically arranged about the center of the second introduction member 120. The plurality of holes 121 may be arranged in a multi-ring structure on the second introduction member 120, and the number of the holes 121 included in each ring structure may be the same or different. Further, the radius of the holes 121 may increase along a direction from the center to the edge of the second introduction member 120. That is, as shown in FIG. 2, in the direction in which the radius of the second introduction member increases, the diameter of the holes 121 in each of the ring structures gradually increases. The holes 121 on each ring may be evenly arranged in the circumferential direction, and the holes 121 on each ring may be aligned with each other in the radial direction.

The plurality of holes 121 of the second introduction member 120 may be formed in a shape similar to a galaxy, and the second introduction member may be referred to as a galaxy-shaped circular plate. As shown in FIG. 2, the plurality of holes 121 of the second introduction member 120 are arranged in a three-ring structure, and each ring structure includes six holes 121, however, this is only an illustrative description. The number of rings of the holes, the number of the holes, and the size of the holes may be set as needed. Further, an outer periphery of the feeding structure 100 is generally covered by a shielding structure to eliminate the external effect of the power supply. On one hand, the second introduction member 120 including the holes 121 may reduce the capacitive reactance between the second introduction member 120 and the shielding structure, reduce power consumption, and reduce power waste; on the other hand, the second introduction member 120 including the holes 121 may facilitate the mounting of the second introduction member 120 and the aesthetic of the second introduction member 120.

FIG. 2 of the present disclosure is merely an example of a second introduction member, but the present embodiment is not limited thereto, and the present embodiment does not limit the shape and arrangement of the holes. In fact, as long as the second introduction member includes a plurality of holes symmetric about its center, the effect of reducing the capacitive reactance and reducing power consumption may be achieved.

Figure 3:
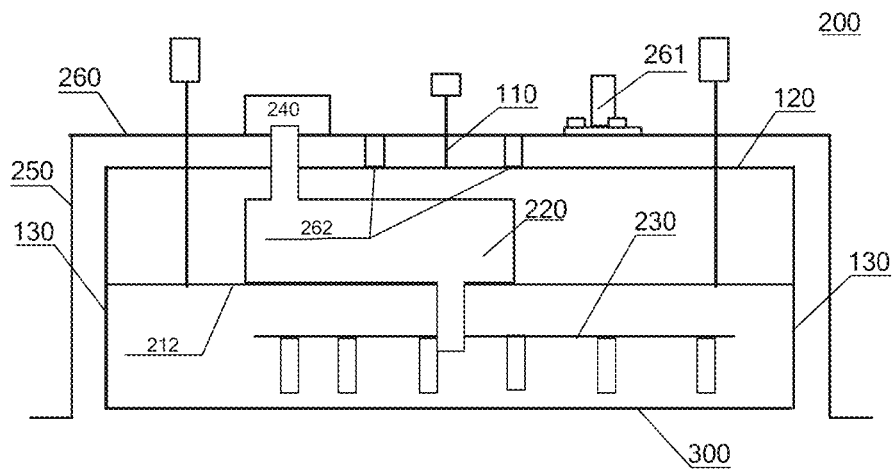
FIG. 3 is a simplified schematic diagram of an upper electrode assembly according to an embodiment of the present disclosure.

An embodiment of the present disclosure provides an upper electrode assembly 200. FIG. 3 is a simplified schematic diagram of the upper electrode assembly 200 according to an embodiment of the present disclosure, and FIG. 4 is a cross-sectional view of the upper electrode assembly 200 according to an embodiment of the present disclosure.

Referring to FIG. 3 to FIG. 9, the upper electrode assembly 200 includes the feeding structure 100 of the previous embodiment for achieving uniform sputtering of the target 300. The upper electrode assembly 200 further includes a RF power supply (not shown) and/or a DC power supply (not shown) coupled to the first introduction member 110 in the feeding structure 100 for providing power to the first introduction member 110.

The structure of the upper electrode assembly 200 of the present embodiment may include the feeding structure 100 of the previous embodiment. As such, during processing, the power provided by the RF power supply and/or the DC power supply may be fed into the center of the second introduction member 120 along the first introduction member 110, and evenly distributed to the respective distribution members 130, such that power may be evenly distributed to the target 300 by the plurality of distribution members 130. In addition, the structure of the upper electrode assembly 200 of the present embodiment may not only uniformly feed the RF power into the target 300, but may also uniformly feed the DC power into the target 300.

Figure 4:
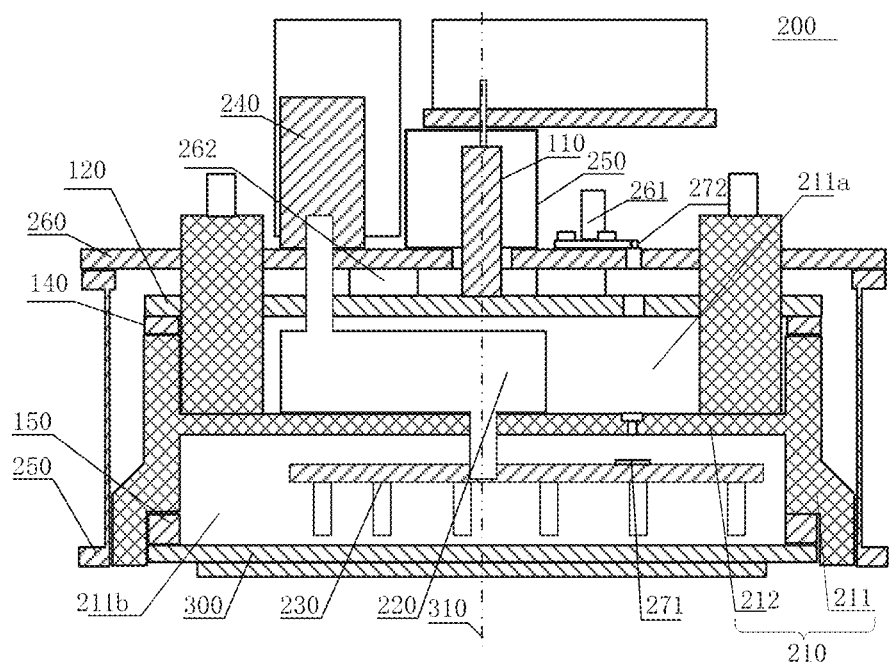
FIG. 4 is a cross-sectional view of the upper electrode assembly according to an embodiment of the present disclosure.
Figure 5:
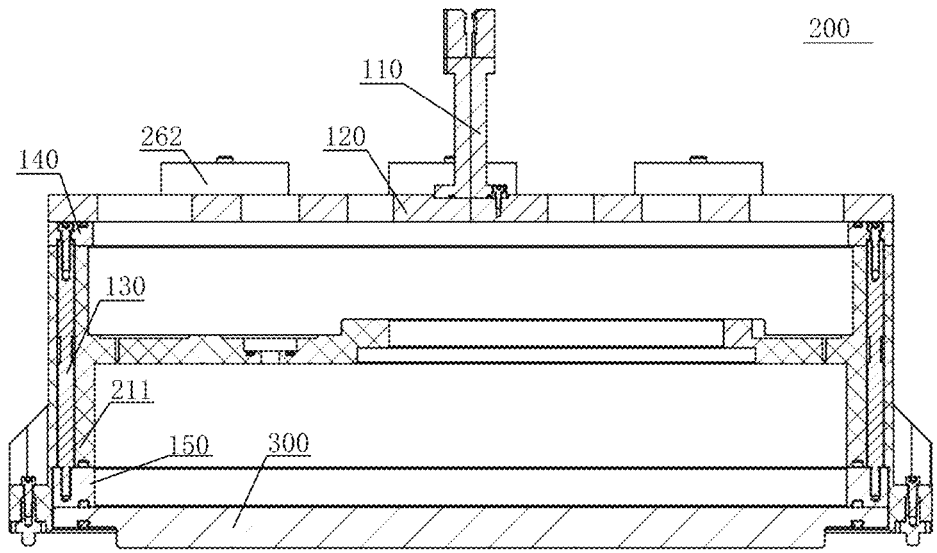
FIG. 5 is a cross-sectional view of the feeding structure and a support base of the upper electrode assembly according to an embodiment of the present disclosure.

As shown in FIG. 3 and FIG. 4, the upper electrode assembly 200 includes a support base 210, which may be made of an insulating material. One end of the support base 210 may be used to support the second introduction member, and the other end of the support base 210 may be used to fix the target 300. Further, the plurality of distribution members 130 may be disposed inside the support base, and may be used to connect the target 300.

The upper electrode assembly 200 further includes a magnetron bearing housing 220. The magnetron bearing housing 220 may be mounted in the support base 210 for converting an external drive along a first axis to an output drive along a second axis. In addition, the first axis may be offset from the axis of the first introduction member 110, and the second axis may coincide with the axis of the first introduction member 110.

More specifically, as shown in FIG. 3 and FIG. 4, as a specific structure of the support base 210, the support base 210 may include a support wall 2111 and a partition layer 212. One end of the support wall 211 may be used to support the second introduction member 120, and the other end of the support wall 211 may be used for fixing to the target 300. The partition layer 212 may be laterally disposed within the support wall 2111 to divide the support wall 212 into a first chamber 211a toward the second introduction member 120, and a second chamber 211b toward the target 300.

In some embodiments, the magnetron bearing housing 220 may be disposed in the first chamber 211a, for example, on the partition layer 212. The magnetron bearing housing 220 may include an input shaft and an output shaft. The input shaft may be configured to receive the external drive along the first axis, and the output shaft may extend through the partition layer 212 into the second chamber 211b and output the output drive described above along the second axis.

In addition, as shown in FIG. 4, the upper electrode assembly 200 further includes a magnetron assembly 230. The magnetron assembly 230 may be disposed within the second chamber 211b, and mounted on the output shaft of the magnetron bearing housing 220.

With the upper electrode assembly 200 of the feeding structure described in the previous embodiment, since the first introduction member 110 of the feeding structure 100 occupies the center position of the upper electrode assembly 200, the position of the structure of the magnetron bearing housing 220 or the like may be offset to avoid affecting the feeding structure 100. The support base 210 of the present embodiment may include a two-layer structure. In particular, the input shaft and the output shaft of the magnetron bearing housing 220 may be different shafts. The output shaft may still be disposed at the axis 310 of the target 300, the input shaft may be offset from the axis 310 of the target 300, and a motor 240 may drive the magnetron assembly 230 to rotate through the magnetron bearing housing 220. The structure of the "central feeding with the offset magnetron" may ensure the uniform distribution of the power supply on the target 300 without affecting the normal operation of the magnetron bearing housing 220 and the like.

In addition, as shown in FIG. 4, the feeding structure 100 may include an introduction ring 140 and an export ring 150 in addition to the first introduction member 110, the second introduction member 120, and the plurality of distribution members 130.

More specifically, as shown in FIG. 4, the second introduction member 120 is fixed to the upper end of the support base 210 through the introduction ring 140, and forms the first chamber 211a with the partition layer 212 and the upper portion of the support base 210. The plurality of distribution members 130 may be disposed inside the support wall 211 and evenly distributed circumferentially along the support wall. In particular, the upper end of the support wall 211 is coupled to the second introduction member 120 through the introduction ring 140. The export ring 150 may be fixed to the lower end of the support wall 211 by screws, and connected to the lower end of the distribution member 130. The target 300 may be fixed to the export ring 150, for example, by screws. Further, the target 300 may be connected to the distribution members 130 via the export ring 150 to be connected to the entire feeding structure 100. The power fed to the second introduction member 120 along the first introduction member 110 may be uniformly fed to the target 300 via the introduction ring 140, the distribution members 130, and the export ring 150. The export ring 150 and the lower end of the support wall 211, and the export ring 150 and the target 300 may be sealed, for example, by a seal ring, such that the second chamber 211b may be sealed.

As shown in FIG. 3 and FIG. 4, the upper electrode assembly 200 further includes a motor 240. The motor 240 may be disposed outside the first chamber 211a. Further, the input shaft of the magnetron bearing housing 220 may pass through the second introduction member 120 and connect to the output shaft of the motor 240.

Figure 6:
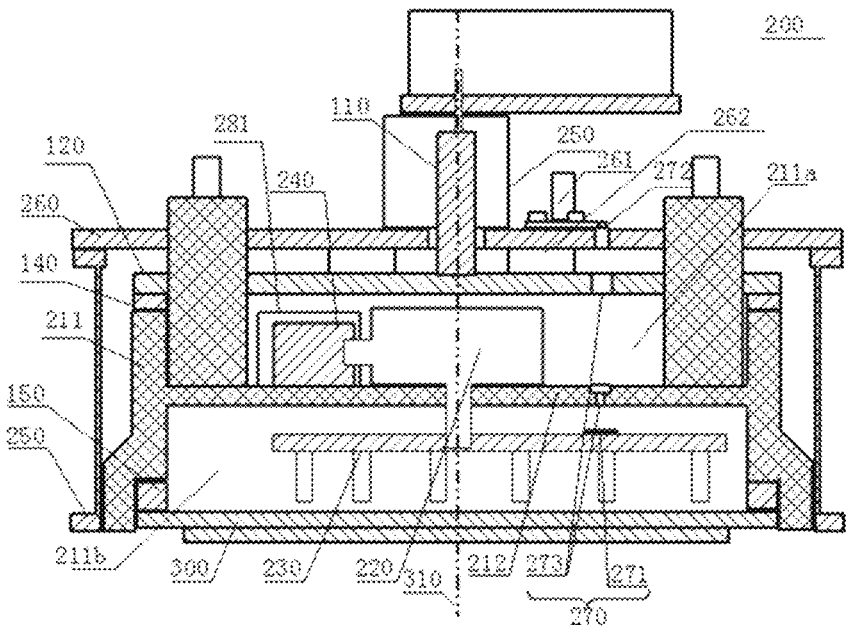
FIG. 6 is a cross-sectional view of the upper electrode assembly according to another embodiment of the present disclosure.

In addition, as shown in FIG. 6, the motor 240 may be disposed in the first chamber 211a. For example, the motor 240 may be on the partition layer 212. The input shaft of the magnetron bearing housing 220 may be connected to the output shaft of the motor 240. Further, the motor 240 may be covered by a shielding structure 281, such that inference from the RF power and DC power to the motor 240 may be shielded. In the present embodiment, the magnetron bearing housing 220 and the motor 240 may both be disposed in the first chamber 211a, which may reduce the number of external components, further reduce the overall size of the upper electrode assembly, and save space.

Figure 7:
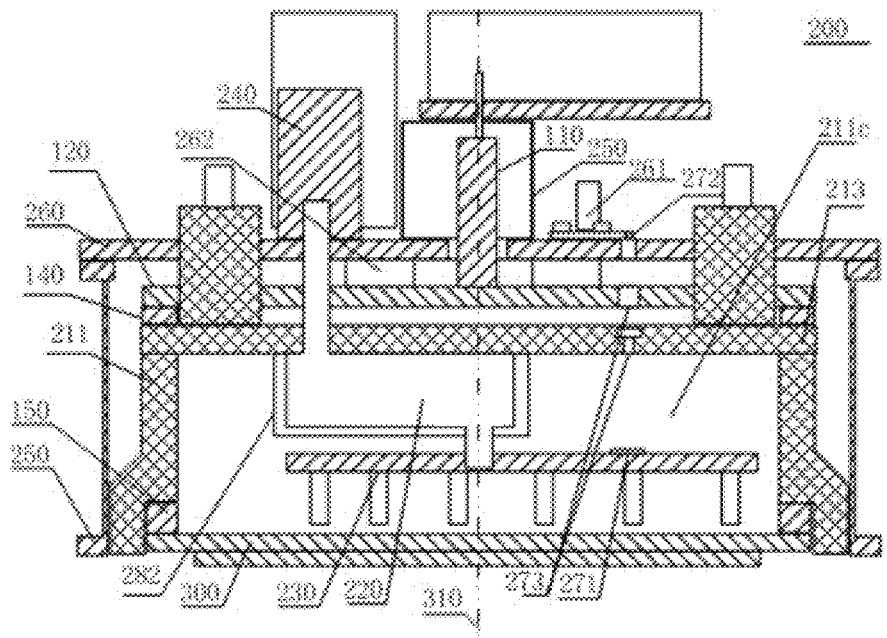
FIG. 7 is a cross-sectional view of the upper electrode assembly according to yet another embodiment of the present disclosure.

As shown in FIG. 7, as a second example structure of the support base 210, the support base 210 includes a support wall 211 and a support cover 213. One end of the support wall 211 may be connected to the support 213 to form a third chamber 211c, and the other end of the support wall 211 may be used for fixing to the target 300. Further, the support cover 213 may be used for supporting the second introduction member 120.

As show in FIG. 7, in the second example structure of the support bass 210, the magnetron bearing housing 220 may be disposed in the third chamber 211c and covered by a waterproof structure 282. The input shaft of the magnetron bearing housing 220 may receive external drive along the first axis, and the output shaft of the magnetron bearing housing 220 may extend through the partition layer 212 into the third chamber 211c and output the output drive described above along the second axis. In addition, the magnetron assembly 230 may also be disposed within the third chamber 211c and mounted on the output shaft of the magnetron bearing housing 220. In the present embodiment, the support base 210 may employs a single chamber (e.g., the third chamber 211c) structure, such that the size of the support base 210 may be reduced, thereby reducing the overall size of the upper electrode assembly 200, and the structure may be more compact to save space.

Similarly, in the second example structure of the support bass 210, the motor 240 may also be arranged in two arrangements.

Figure 8:
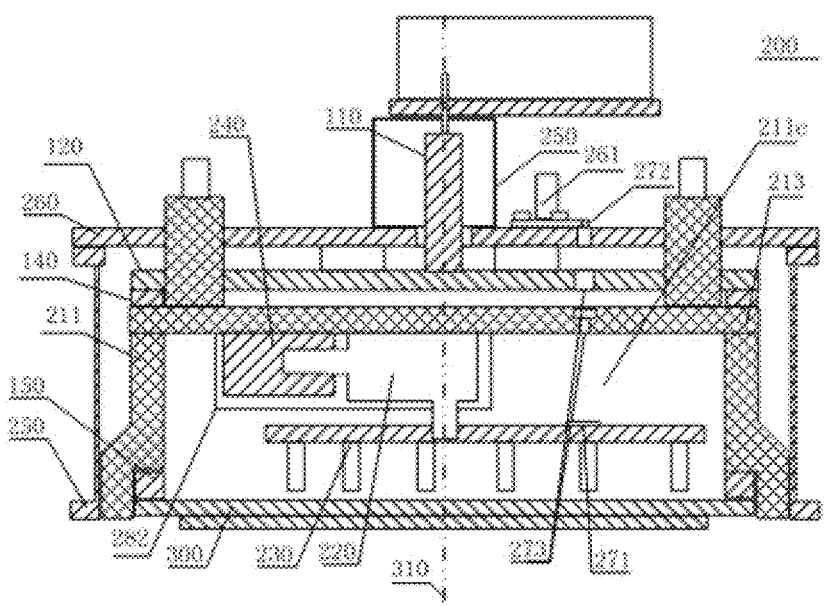
FIG. 8 is a cross-sectional view of the upper electrode assembly according to still another embodiment of the present disclosure.

In the first arrangement, as shown in FIG. 8, the motor 240 may be disposed in the third chamber 211c. As such, the motor 240 may also need to be covered by the waterproof structure 282.

Figure 9:
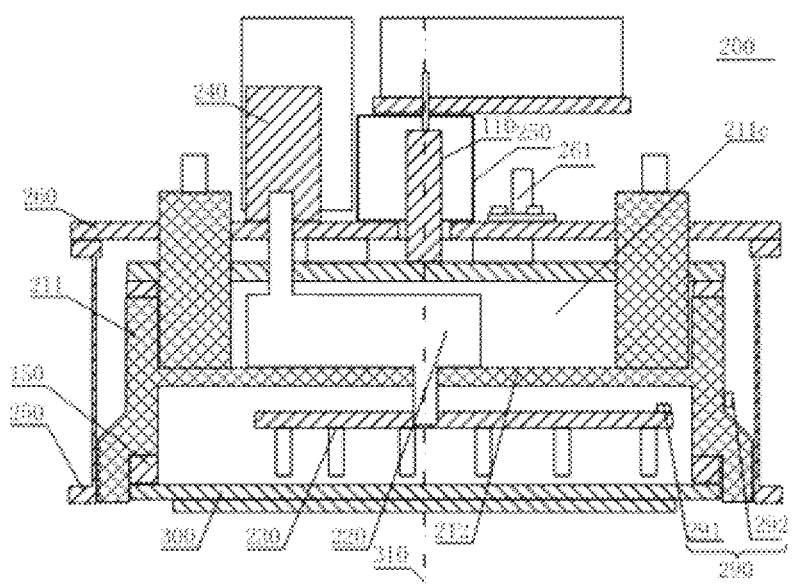
FIG. 9 is a cross-sectional view of the upper electrode assembly according to yet another embodiment of the present disclosure.

In the second arrangement, as shown in FIG. 9, the motor 240 may be disposed outside the third chamber 211c. The input shaft of the magnetron bearing housing 220 may pass through the support cover 213 and the second introduction member 120 in sequence, and connect to the output shaft of the motor 240. The magnetron bearing housing 220 and the motor 240 may both be disposed in the third chamber 211c, which may reduce the number of external components, further reduce the overall size of the upper electrode assembly, and save space.

In order to electromagnetically shield the upper electrode assembly 200, as shown in FIG. 6 to FIG. 9, the upper electrode assembly 200 may further include a shielding cover 250 and a shielding plate 260. The shielding cover 250 may be disposed on the periphery of the support base 210, and the shielding plate 260 may be secured to a top surface of the shielding cover 250, such as by screws, and an electrically conductive connection may be enhanced by using, for example, a RF gasket, to define a shielded space. Further, the shielding plate 260 may be fixed to a top surface of the second introduction member 120 through an insulating pad 262. The insulating pad 262 may have certain thickness, such that the second introduction member 120 and the shielding plate 260 may be spaced apart. Since the second introduction member 120 includes a plurality of holes 121, the capacitive reactance between the second introduction member 120 and the shielding plate 260, the power consumption, and the power waste may be reduced. In some embodiments, four cover opening mechanism connectors 261 may be symmetrically mounted on the top surface of the shielding plate 260 for mounting a cover opening bracket.

In one embodiment, as shown in FIG. 4, the input shaft of the magnetron bearing housing 220 may be connected to the output shaft of the motor 240 along an axis that is offset from a target axis. More specifically, the axis offsetting from the target axis may be an axis that is at a distance from the target axis 310 in the radial direction of the target 300, and parallel tot eh target axis 310, however, the present disclosure is not limited thereto. In other embodiments, the axis offsetting from the target axis may also be an axis extending from the target axis at an angle to the target axis. At the same time, since the shielding plate may be fixed to the top surface of the second introduction member through the insulating pad, the distance between the second introduction member and the shielding plate may be relatively large, and the opposing area may be relatively small. As such, the DC power or the RF power consumption may be reduced, thereby reducing power waste.

Still referring to FIG. 4, the upper electrode assembly 200 of the present embodiment further includes a photoelectric detection assembly 270 for detecting a rotational state of the magnetron assembly 230. For example, the photoelectric detection assembly 270 may include a reflective plate 271 and a photoelectric sensor 272. The reflective plate 271 may be mounted on the surface of the magnetron assembly 230 facing the partition layer 212, and the photoelectric sensor 272 may be mounted on the shielding plate 260 to correspond to the position of the reflective plate 271. In addition, a transparent quartz window 271 may be arranged at a corresponding position of the partition layer 212 and the second introduction member 120. In particular, the reflective plate 271, the transparent quartz window 273, and the photoelectric sensor 272 may form a photoelectric sensing path, and detect the rotational state of the magnetron assembly 230.

As shown in FIG. 9, the upper electrode assembly 200 of the present embodiment further includes a magnetic inductive detection assembly 290 for detecting the rotational state of the magnetron assembly in place of the photoelectric detection assembly. For example, the magnetic inductive detection assembly 290 may include a magnet 291 and a magnetic proximity switch 292. The magnet 291 may be fixed to the edge of the magnetron assembly 230, and the magnetic proximity switch 292 may be mounted outside the support wall 211. When the magnetron assembly 230 rotates, the distance between the magnet 291 and the magnetic proximity switch 292 may change periodically with the rotation of the magnet 291, and when the magnet 291 approaches the magnetic proximity switch 292, the magnetic proximity switch 292 may transmit a signal to detect the rotational state of the magnetron assembly 230.

Another embodiment of the present disclosure further provides a physical vapor deposition chamber. The physical vapor deposition chamber may include a reaction chamber and the upper electrode assembly described in the previous embodiments. The upper electrode assembly may be disposed on top of a chamber body, the reaction chamber may include a substrate supporting member for arranging the substrate, and the substrate may be opposite to the position of the target. The upper electrode assembly may sputter the target, and the sputtered material may be deposited onto the substrate to from a uniform film on the substrate.

Another embodiment of the present disclosure further provides a physical vapor deposition device. The physical vapor deposition device may include the physical vapor deposition chamber described above, a loading/unloading chamber, and a transfer chamber. The loading/unloading chamber may be configured to load a substrate, and the transfer chamber may be disposed between the physical vapor deposition chamber and the loading/unloading chamber for transporting the substrate from the loading/unloading chamber to the physical vapor deposition chamber.

The specific embodiments described above are intended to be illustrative of the purposes, technical solutions and beneficial effects of the present disclosure. It should be understood that the above description is merely specific embodiments of the present disclosure, and are not used to limit the present disclosure. Any modifications, equivalent substitutions, improvements, and the like, which are within the spirit and principles of the present disclosure, are intended to be included within the protection scope of the present disclosure.

It should be noted that in the previous embodiments, the directional terminology used, such as "top," "bottom," "front," "back," etc., is used with reference to the orientation of the Figure(s) being described. The components of the present disclosure can be positioned in a number of different orientations. As such, the directional terminology is used for purposes of illustration and is in no way limiting the protection scope of the present disclosure. Throughout the drawings, the same elements are denoted by the same or similar reference numerals. Conventional structures or configurations may be omitted when it may cause confusion to the understanding of the present disclosure.

Further, the shapes and dimensions of various components in the accompanying drawings do not reflect the true size and scale, and merely illustrate the content of the embodiments of the present disclosure. In addition, in the claims, any reference symbol located within a parenthesis should not be constructed as limitation to the claims.

Numerical parameters in the present specification and the appended claims are approximated values unless otherwise defined, and can vary depending upon the desired characteristics obtained through the present disclosure. In particular, all numbers expressing the content, reaction conditions, and the like, which are used in the specification and claims, are to be understood as being modified by the term "about" in all cases. In general, the meaning of its expression is meant to encompass a variation of ±10% of a particular number in some embodiments, a variation of ±5% of a particular number in some embodiments, a variation of ±1% of a particular number in some embodiments, a variation of ±0.5% of a particular number in some embodiments.

In addition, the word "comprising" does not exclude elements or steps which are not recited in the claims. The word "a" or "an" does not exclude a plural of such elements.

The use of the ordinal numbers such as "first", "second", "third" and the like in the specification and claims for modifying corresponding elements does not mean that the elements has an ordinal number, or there is an order of one element and another element. The ordinal numbers are only used to enable a component having a certain name to be clearly distinguished from another component having the same name.

Similarly, it should be understood that various features of the present disclosure are sometimes grouped together into a single embodiment, a single figure, or description thereof in the above description of the example embodiments of the present disclosure, so as to simplify the present disclosure and facilitate the understanding of one or more of the aspects of the present disclosure. However, the method according to the present disclosure is not to be interpreted as reflecting the intention that the claimed disclosure requires more features than those specifically recited in the claims. Rather, as disclosed in the following claims, the disclosed aspects are less than all features of a single embodiment disclosed above. Therefore, the claims following the specific embodiments are hereby explicitly incorporated into the specific embodiments, and each of the claims per se is used as a separate embodiment of the present disclosure.

It can be understood that the foregoing embodiments are merely exemplary embodiments used for describing the principle of the present disclosure, but the present disclosure is not limited thereto. Those of ordinary skill in the art may make various variations and improvements without departing from the spirit and essence of the present disclosure, and these variations and improvements shall fall into the protection scope of the embodiments of the present disclosure.

What is claimed is:

1. A feeding structure for a physical vapor deposition device, comprising:
   a first introduction member configured to receive power;
   a second introduction member including a plurality of holes and coupled to the first introduction member;
   a plurality of distribution members evenly distributed around an axis of the first introduction member; and
   an introduction ring and an export ring;
   wherein:
      all sizes of a portion of the plurality of holes along a radial direction increase with distances between the portion of the holes and the axis of the first introduction member; and
      one end of each distribution member is coupled, through the introduction ring, to the second introduction member at a periphery of the second introduction member, and the other end of each distribution member is coupled to a target through the export ring and configured to provide power to the target.

2. The feeding structure of claim 1, wherein the first introduction member and the second introduction member are disposed coaxially with the target.

3. The feeding structure of claim 1, wherein the plurality of holes are disposed symmetrically about a center of the second introduction member.

4. The feeding structure of claim 3, wherein the plurality of holes are arranged in a multi-ring structure on the second introduction member, and each ring structure includes a same number of holes.

5. The feeding structure of claim 1, wherein the distribution members include a circular cross-section, and a diameter of the distribution members is about 10 mm or more.

6. An upper electrode assembly, comprising:
   a feeding structure comprising a first introduction member configured to receive power; a second introduction member including a plurality of holes and coupled to the first introduction member; a plurality of distribution members evenly distributed around an axis of the first introduction member; and an introduction ring and an export ring; and
   wherein:
      all sizes of a portion of the plurality of holes along a radial direction increase with distances between the portion of the holes and the axis of the first introduction member; and
      one end of each distribution member is coupled, through the introduction ring, to the second introduction member at a periphery of the second introduction member, and the other end of each distribution member is coupled to a target through the export ring and configured to provide power to the target;

a radio frequency (RF) power supply or a direct current (DC) power supply coupled to the first introduction member.

7. The upper electrode assembly of claim 6, further comprising:
a support base, one end of the support base being configured to support the second introduction member and the other end of the support base being configured to fix the target, and the plurality of distribution members being disposed in the support base and configured to couple to the target; and
a magnetron bearing housing mounted to the support base for converting an external drive along a first axis to an output drive along a second axis, the first axis being offset from an axis of the first introduction member.

8. The upper electrode assembly of claim 7, wherein the support base comprises:
a support wall, one end of the support wall being configured to support the second introduction member and the other end of the support wall being fixed to the target;
a partition layer laterally disposed within the support wall to divide the support wall into a first chamber facing the second introduction member and a second chamber facing the target, wherein the magnetron bearing housing is disposed in the first chamber and includes: an input shaft configured to receive the external drive along the first axis; an output shaft extending through the partition layer into the second chamber and outputting the output drive along the second axis, the second axis coinciding with the axis of the first introduction member; and
a magnetron assembly disposed within the second chamber and mounted on the output shaft.

9. The upper electrode assembly of claim 8, further comprising:
a motor disposed outside the first chamber;
wherein the input shaft of the magnetron bearing housing passes through the second introduction member and connects to an output shaft of the motor.

10. The upper electrode assembly of claim 8, further comprising:
a motor disposed within the first chamber and covered by a shielding structure;
wherein the input shaft of the magnetron bearing housing is connected to an output shaft of the motor.

11. The upper electrode assembly of claim 7, wherein:
the support base includes a support wall and a support cover;
one end of the support wall is connected to the support cover to form a chamber, and the other end of the support wall is fixed to the target;
the support cover is configured to support the second introduction member;
the magnetron bearing housing is disposed in the chamber and covered by a waterproof structure, the magnetron bearing housing including:
an input shaft configured to receive the external drive along the first axis; and
an output shaft arranged in the chamber and outputting the output drive along the second axis, the second axis coinciding with the axis of the first introduction member; and
the upper electrode assembly further includes:
a magnetron assembly disposed within the chamber and mounted on the output shaft.

12. The upper electrode assembly of claim 11, further comprising:

a motor disposed outside the chamber;
wherein the input shaft of the magnetron bearing housing passes through the support cover and the second introduction member in sequence and connects to an output shaft of the motor.

13. The upper electrode assembly of claim 11, further comprising:
a motor disposed in the chamber and covered by the waterproof structure;
wherein the input shaft of the magnetron bearing housing is connected to an output shaft of the motor.

14. The upper electrode assembly of claim 7, further comprising:
a shielding cover arranged on a periphery of the support base; and
a shielding plate disposed on a top end of the shielding cover and fixed to a top surface of the second introduction member by an insulating pad, and the first introduction member passes through the shielding plate.

15. A physical vapor deposition chamber, comprising:
a chamber body; and
an upper electrode assembly disposed on top of the chamber body, the upper electrode assembly comprising a feeding structure comprising a first introduction member configured to receive power; a second introduction member including a plurality of holes and coupled to the first introduction member; a plurality of distribution members evenly distributed around an axis of the first introduction member; and an introduction ring and an export ring; and a radio frequency (RF) power supply or a direct current (DC) power supply coupled to the first introduction member;
wherein:
all sizes of a portion of the plurality of holes along a radial direction increase with distances between the portion of the holes and the axis of the first introduction member; and
one end of each distribution member is coupled, through the introduction ring, to the second introduction member at a periphery of the second introduction member, and the other end of each distribution member is coupled to a target through the export ring and configured to provide power to the target.

16. A physical vapor deposition device, comprising:
a physical vapor disposition chamber comprising a chamber body; and
an upper electrode assembly disposed on top of the chamber body, the upper electrode assembly comprising a feeding structure including a first introduction member configured to receive power; a second introduction member including a plurality of holes and coupled to the first introduction member; a plurality of distribution members evenly distributed around an axis of the first introduction member; and an introduction ring and export ring; and a radio frequency (RF) power supply or a direct current (DC) power supply coupled to the first introduction member;
wherein:
all sizes of a portion of the plurality of holes along a radial direction increase with distances between the portion of the holes and the axis of the first introduction member; and
one end of each distribution member is coupled, through the introduction ring, to the second introduction member at a periphery of the second introduction member, and the other end of each distribution member is coupled to a target through the export ring and configured to provide power to the target.

17. The physical vapor deposition device of claim 16, wherein the upper electrode assembly further includes:
   a support base, one end of the support base being configured to support the second introduction member and the other end of the support base being configured to fix the target, and the plurality of distribution members being disposed in the support base and configured to couple to the target; and
   a magnetron bearing housing mounted to the support base for converting an external drive along a first axis to an output drive along a second axis, the first axis being offset from an axis of the first introduction member.

18. The physical vapor deposition device of claim 17, wherein the support base includes:
   a support wall, one end of the support wall being configured to support the second introduction member and the other end of the support wall being fixed to the target;
   a partition layer laterally disposed within the support wall to divide the support wall into a first chamber facing the second introduction member and a second chamber facing the target; the magnetron bearing housing being disposed in the first chamber and including: an input shaft configured to receive the external drive along the first axis; an output shaft extending through the partition layer into the second chamber and outputting the output drive along the second axis, the second axis coinciding with the axis of the first introduction member; and
   a magnetron assembly disposed within the second chamber and mounted on the output shaft.

19. The physical vapor deposition device of claim 18, the upper electrode assembly further comprising:
   a motor disposed outside the first chamber;
   wherein the input shaft of the magnetron bearing housing passes through the second introduction member and connects to an output shaft of the motor.

20. The physical vapor deposition device of claim 18, the upper electrode assembly further comprising:
   a motor disposed within the first chamber and covered by a shielding structure;
   wherein the input shaft of the magnetron bearing housing is connected to an output shaft of the motor.

\* \* \* \* \*